(12) United States Patent
Ichikawa et al.

(10) Patent No.: US 7,361,909 B2
(45) Date of Patent: Apr. 22, 2008

(54) METHOD AND APPARATUS FOR CORRECTING DRIFT DURING AUTOMATED FIB PROCESSING

(75) Inventors: Ryoichi Ichikawa, Saitama (JP); Akihiko Haraguchi, Tokyo (JP); Yuji Hasegawa, Tokyo (JP); Naohito Inoue, Tokyo (JP); Kazutomo Shimizu, Saitama (JP)

(73) Assignee: Jeol Ltd., Tokyo (JP)

( * ) Notice: Subject to any disclaimer, the term of this patent is extended or adjusted under 35 U.S.C. 154(b) by 372 days.

(21) Appl. No.: 11/287,503

(22) Filed: Nov. 23, 2005

(65) Prior Publication Data

US 2006/0138356 A1  Jun. 29, 2006

(30) Foreign Application Priority Data

Nov. 30, 2004  (JP) .............................. 2004-346222

(51) Int. Cl.
*H01J 37/08* (2006.01)
(52) U.S. Cl. ............... 250/491.1; 250/492.2; 250/492.1; 250/492.3; 250/492.23; 250/306; 250/307; 250/309; 430/30; 430/5; 356/237.5; 382/144

(58) Field of Classification Search ..................... None
See application file for complete search history.

(56) References Cited

U.S. PATENT DOCUMENTS 6,888,149 B2   5/2005   Ikku

FOREIGN PATENT DOCUMENTS

| JP | 09-274879 | 10/1997 |
| JP | 2003-331775 | 11/2003 |

*Primary Examiner*—Jack Berman
*Assistant Examiner*—Zia R. Hashmi
(74) *Attorney, Agent, or Firm*—The Webb Law Firm

(57) ABSTRACT

A method and apparatus for correcting drift of the beam irradiation position during automated FIB (focused ion beam) processing with a reference image-setting unit, an image read-in unit for reading in images of the reference image region during the FIB processing, an arithmetic-and-control unit for finding the direction and amount of image deviation between the subsequent images, and a beam deflection system-adjusting unit for correcting the beam deflection system by correcting the image deviation based on the deviation in response to the output from the arithmetic-and-control unit. The arithmetic-and-control unit optimizes the brightness or contrast of the reference image.

5 Claims, 2 Drawing Sheets

METHOD AND APPARATUS FOR CORRECTING DRIFT DURING AUTOMATED FIB PROCESSING

BACKGROUND OF THE INVENTION

1. Field of the Invention

The present invention relates to a method and apparatus for correcting drift during automated focused ion beam (FIB) processing.

2. Description of Related Art

Where a sample surface is irradiated with a focused ion beam (FIB) by an FIB system to micromachine the surface, if the beam irradiation time is prolonged, the sample stage on which the sample is placed and electronics drift with time. Consequently, it may be impossible to perform beam lithography accurately. Especially, as design rules of semiconductor devices have become more exacting, the positional accuracy required in microlithography has decreased below 100 nm. To realize such a high positional accuracy, the amount of drift of the beam irradiation position during the lithography process needs to be reduced by a factor of about 10, i.e., be less than 10 nm. Therefore, an intrinsic mark is put on the sample. Based on positional deviation of the mark, error in the beam irradiation position due to drift is corrected (see, for example, Japanese Patent Laid-Open No. H9-274879 (paragraphs 0009-0011; FIG. 1)).

Another technique for correcting the beam irradiation position is also known. In particular, a straight geometry is delineated in a direction parallel to a sample cross section to be created. During the micromachining, this straight geometry to be processed is referenced. Positions lying along a limited straight line extending at right angles to the straight geometry are measured. Drift of the beam irradiation position is corrected using the measured positions (see, for example, Japanese Patent Laid-Open No. 2003-331775 (paragraphs 0017-0031; FIG. 1)).

In the prior art FIB system of this kind, the sample stage is moved using an accurate pulsed motor or a mark for the stage. Accordingly, after determining the stage position, micromachining is started, and the position is corrected. That is, correction of drift is made after start of the micromachining.

The present situation is that where automated micromachining involving movement of the sample stage is carried out at the ion beam position by the aforementioned prior art technique, movement of the stage is corrected using some mark. The FIB system is intended to automatically micromachine the sample. Because there are plural beam irradiation positions at which processing is performed, it has been difficult to reproduce the stage position accurately because of the mechanical accuracy. Consequently, a correction has been made by movement of the stage with enhanced mechanical accuracy of the stage or an intrinsic mark on the stage. In this way, the stage position has been reproduced.

Furthermore, where the method consisting of reading a signal reflected from a sample when it is irradiated with a beam and correcting the sample position is implemented, powder flying off the processed region may adhere to the reference image region or the processing beam may scatter within the processed region. Therefore, the resulting image becomes totally white or black. This makes it impossible to precisely read the image in the reference image region. Consequently, there arises the problem that the processing accuracy deteriorates.

SUMMARY OF THE INVENTION

It is an object of the present invention to provide a method and apparatus for correcting drift during automated FIB processing to thereby permit a sample to be micromachined precisely.

The present invention provides a method of correcting drift during automated FIB (focused ion beam) processing of a sample, the method comprising the steps of: setting a reference image region on the sample; obtaining a first image of the reference image region before ion beam irradiation; obtaining a second image (used for check) of the reference image region after the ion beam irradiation; calculating the direction and amount of the image deviation from the first and second images; and adjusting a beam-adjusting system based on the calculated direction and amount of the image deviation. Where the second image (check image) obtained after the irradiation has brightness or contrast not adapted for detection of the deviation, the deviation is found using a checking image obtained at appropriate brightness or contrast.

According to the present invention, an accurate reference image can be read in. Consequently, the sample can be processed accurately.

Other objects and features of the invention will appear in the course of the description thereof, which follows.

DESCRIPTION OF THE PREFERRED EMBODIMENTS

The preferred embodiments of the present invention are hereinafter described in detail with reference to the accompanying drawings.

Figure 1:
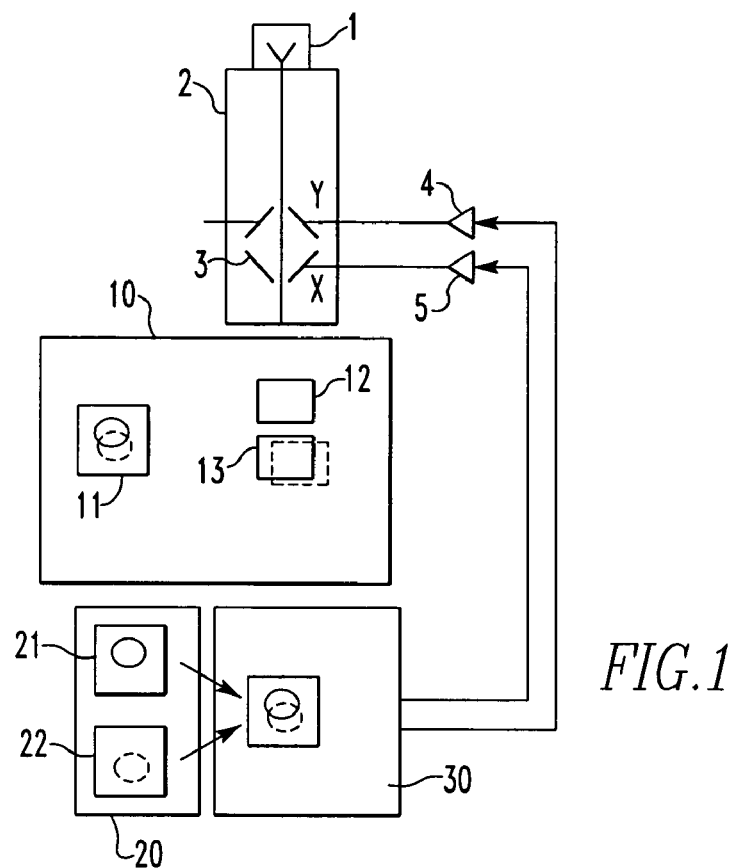
FIG. 1 is a diagram showing main portions of a drift correction apparatus according to the present invention.

FIG. 1 shows the main portions of a drift correction apparatus of the present invention. An ion source 1 emits an ion beam which is converged by an optical system 2. The ion beam is deflected by a deflector 3 acting as a beam deflection system-adjusting means. A processing setting screen 10 includes a reference image region 11, a first lithography region 12, and a second lithography region 13.

Figure 2:
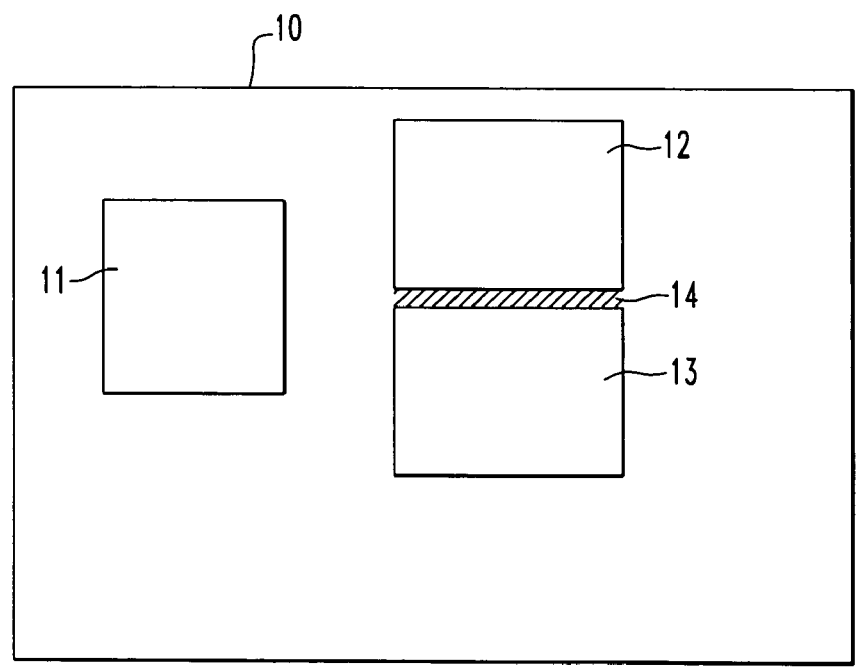
FIG. 2 is a diagram illustrating a processing setting screen.

FIG. 2 shows the processing setting screen, which corresponds to the region of the sample scanned by the ion beam and is given by reference image setting means (not shown). The reference image region 11 is used to measure drift produced when ion beam lithography is carried out. An image read in from the reference image region 11 should have some kind of structure.

The first lithography region 12 and the second lithography region 13 are actually irradiated with an ion beam to perform lithography (e.g., perform etching). A thin region 14 is located between the first lithography region 12 and the second lithography region 13 and becomes a thin film. That is, the sample is etched separately between the first and second lithography regions. Thus, the region located between the two lithography regions is formed. This thin region 14 is observed with a SEM (scanning electron microscope) or TEM (transmission electron microscope).

Referring back to FIG. 1, an image read-in means 20 reads in an image of the reference image region 11. In particular, the reference image region 11 is scanned with the ion beam. A signal of particles reflected from the reference image region 11 is detected by a detector and converted into an electrical signal. As an example, a PMT (photomultiplier tube) is used as the image read-in means 20. An image 21 is obtained prior to drift. An image 22 is obtained after the drift. An arithmetic-and-control means 30 receives information about an image read in from the image read-in means 20 and finds the direction and amount of image deviation from the images produced respectively prior to and after the ion beam irradiation. A computer is used as the arithmetic-and-control means 30, for example.

The arithmetic-and-control means 30 finds the amount of correction to the position from the direction and amount of the deviation and supplies to the deflector 3 the calculated amount as an amount of correction to the deviation. In particular, x- and y-direction correction amount signals delivered from the arithmetic-and-control means 30 are amplified by amplifiers 4 and 5 and then fed to the deflector 3. The operation of the apparatus constructed in this way is described below.

First, the processing setting screen 10 is set up. This is achieved by setting an appropriate region on the sample by an operator. If this setting screen 10 is set, the operator determines the reference image region 11 using the reference image setting means (not shown). A portion most suitable for calculation of the direction and amount of image deviation produced before and after ion beam irradiation is used as the reference image region.

Then, the first and second lithography regions are determined. These two regions are necessary to create a thin region 14 of the sample to be observed with a TEM or other instrument. The area etched by the ion beam and the distance between the first and second lithography regions are determined. The distance between the two lithography regions is equal to the thickness of the thin region 14. Data about the reference image region 11, first lithography region 12, and the second lithography region 13 determined in this way is stored in a memory (not shown) ancillary to the arithmetic-and-control means 30.

After determining the reference image region 11, first lithography region 12, and second lithography region 13 in this way, the operator starts operation of the apparatus. The arithmetic-and-control means 30 causes the deflector 3 to scan the reference image region 11 based on positional data about the reference image region 11, the data being stored in the ancillary memory, and reads in image data 21 obtained prior to drift. The image data 21 read in is stored in the memory ancillary to the arithmetic-and-control means 30.

The arithmetic-and-control means 30 then causes the deflector 3 to scan the first lithography region 12. The scan is repeated until the sample is etched to a desired depth. For example, if scan of the whole first lithography region is performed five times, the scanning operation of the apparatus is stopped, and then operations for correcting the image deviation are performed. More specifically, the reference image region 11 is scanned to obtain information about an image 22 produced after the drift. A Fourier transform is performed between the image information 20 obtained in this way and the image information 21 which was produced prior to the drift and is stored in the memory. Thus, the direction and amount of the image deviation are detected. In particular, the arithmetic-and-control means 30 performs a Fourier transform between the image information produced prior to the drift and image information produced after making five scans, thus detecting the positional deviation of the image. The technique for finding image deviation using Fourier transform is well known (e.g., see Japanese Patent Laid-Open No. H9-43173). The direction and amount of the image deviation can be found accurately using a Fourier transform. The number of the scans is not limited to the aforementioned five. Rather, the number of the scans can be set to any arbitrary number.

Where operations described above are performed, powder of the sample etched in the first lithography region 12 adheres to the reference image region 11, and the adhered powder scatters the processing beam in the reference image region 11. Furthermore, the reference image region 11 itself scatters the processing beam. As a result, the produced image of the reference image region 11 may become totally white or black. If this phenomenon occurs, the image in the reference image region cannot be read precisely.

Accordingly, in the present invention, when image information is read in after making five scans or more, the brightness and contrast of the read image region are judged. If the brightness is too high, the image will become totally white. If the brightness is too low, the image will become totally black. Furthermore, if the contrast is bad, the structure in the image cannot be discerned. Since the present invention provides a lithography technique, such undesirable problems are very serious. Accordingly, in these cases, the image which has been read in is converted into appropriate brightness or contrast and then the image data is corrected. A specific example of the adjustment method is described below.

Figure 3:
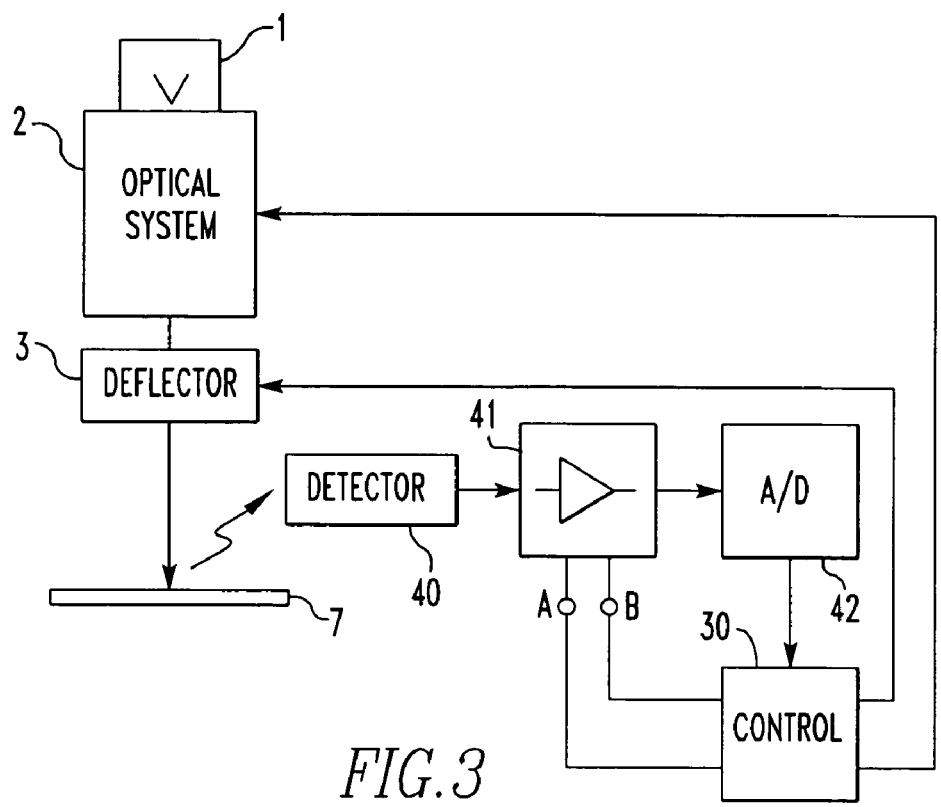
FIG. 3 is a block diagram illustrating a system for adjusting brightness or contrast.

FIG. 3 shows a brightness or contrast adjustment system. Like components are indicated by like reference numerals in both FIGS. 1 and 3. Shown in FIG. 3 are an ion gun 1, an optical system 2 for converging the ion beam, a deflector 3 for scanning the ion beam passed through the optical system 2, and a sample 7 irradiated with the ion beam.

A secondary electron detector 40 detects secondary electrons ejected from the sample 7. An image signal detected by the secondary electron detector 40 is amplified by an amplifier 41. The output from the amplifier 41 is converted into digital image data by an A/D converter 42. An arithmetic-and-control means 30 adjusts the brightness or contrast of the read image in response to the output from the A/D converter 42. The output signal from the arithmetic-and-control means 30 is supplied as a control signal to input terminals A and B of the amplifier 41. The arithmetic-and-control means 30 supplies control signals to the optical system 2 and to the deflector 3.

The input terminal A of the amplifier 41 is a control-signal input terminal for adjustment of the brightness. The input terminal B is a control-signal input terminal for adjusting the contrast. The secondary electron detector 40 and the amplifier 41 together constitute the image read-in means 20 of FIG. 1. The operation of the apparatus constructed in this way is described below.

It is assumed that five scans, for example, have been completed for lithography of the sample. The arithmetic-and-control means 30 supplies a control signal to the deflector 3 to scan the reference image region 11 of the sample 7. At this time, secondary electrons are ejected from the surface of the sample in response to the image. The secondary electrons are detected by the secondary electron detector 40. The output signal from the detector 40 is amplified by the amplifier 41. The output signal from the amplifier 41 is supplied to the A/D converter 42. The control input terminals A and B of the amplifier 41 are set to their respective given values. The A/D converter 42 converts the reference image signal into digital image data and supplies the data to the arithmetic-and-control means 30.

The arithmetic-and-control means 30 makes a decision as to whether the brightness or contrast indicated by the input reference image signal is appropriate, using a given image-processing algorithm which can be realized using an existing technique. For example, where the brightness of the reference image is too high, almost all bits of the image data have a value of 1. Where the brightness of the reference image is too low, almost all bits of the image data have a value of 0. Consequently, the brightness or darkness of the image can be judged. The state of the contrast can be judged using a given image-processing algorithm.

Where the brightness and contrast of the image judged in this way is appropriate, the arithmetic-and-control means 30 executes the aforementioned lithography of the sample intact. If the brightness of the image is judged to be inappropriate, the arithmetic-and-control means 30 supplies a control signal to the input terminal A of the amplifier 41. As a result, the output of the amplifier 41 is set to an appropriate value. On the other hand, if the contrast of the image is judged to be inappropriate, the arithmetic-and-control means 30 supplies a control signal to the input terminal B of the amplifier 41. As a result, the output of the amplifier is set to an appropriate value.

When the reference image data is made to assume an appropriate value in this way, a Fourier transform is performed between the reference image data stored in the memory and the image data read in by the secondary electron detector 40 to calculate the direction or amount of the deviation of the position of the image. After finding the amount of correction in this way, the arithmetic-and-control means 30 controls the deflector 3 to make a scan at the correction position across the lithography region, thus processing the sample.

In this way, according to the present invention, if the brightness or contrast of the checking image obtained after drift is not appropriate for detection of deviation, an adjustment is made such that the brightness or contrast becomes appropriate. A checking image is obtained at appropriate brightness or contrast. Using this obtained checking image, the positional deviation of the image is found. Consequently, an accurate reference image can be read in. Hence, the sample can be processed precisely.

Figure 4:
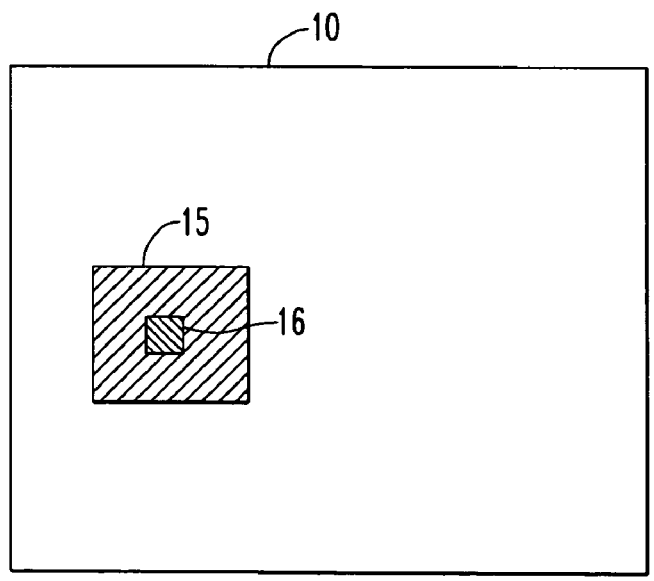
FIG. 4 is a diagram illustrating a method of forming a mark.

In the description made so far, a region in which some kind of structure existing within the sample is used as the reference image. However, depending on the sample, there exists almost no structure. In such a case, it is necessary to use a certain mark. A method of forming the mark is described below. FIG. 4 illustrates the method of forming the mark. In FIG. 4, a processing setting screen is indicated by numeral 10 and includes a deposition region 15. A hole 16 is formed around the center of the deposition region 15 by etching.

Where the mark is formed, the deposition region 15 is first formed. Then, the hole 16 is formed around the center of the deposition region 15 by etching. This can make clearer the image structure as the reference image. Where an image of a region including such a mark is used as a reference image, the deviation and amount of image can be found more accurately.

In the description of the embodiments given above, a Fourier transform is used to find the direction and amount of image deviation. However, the invention is not limited thereto. The direction and amount of image deviation may be found using an image processing technique other than the Fourier transform technique as long as the direction and amount of image deviation can be found.

Having thus defined our invention with the detail and particularity required by the Patent Laws, what is desired protected by Letters Patent is set forth in the following claims.

The invention claimed is:

1. A method of correcting drift during automated FIB processing of a sample, comprising the steps of:
   setting a reference image region on the sample;
   obtaining a second image of said reference image region after the ion beam irradiation;
   calculating direction and amount of image deviation from the first and second images; and
   adjusting a beam deflection system based on the calculated direction and amount of image deviation;
   wherein if the second image obtained as a checking image after the ion beam irradiation has brightness or contrast not suitable for detection of the deviation, a checking image obtained at appropriate brightness or contrast is used in finding the image deviation.

2. A method of correcting drift during automated FIB processing as set forth in claim 1, wherein Fourier transformation is used as a means for finding the direction and amount of the image deviation from said first and second images.

3. A method of correcting drift during automated FIB processing as set forth in claim 1, wherein said reference image region has a mark having a certain shape.

4. A method of correcting drift during automated FIB processing as set forth in claim 1, wherein the direction and amount of the image deviation are found from said first and second images using an image processing technique other than Fourier transformation.

5. An apparatus for correcting drift during automated FIB processing of a sample, said apparatus comprising:
   reference image-setting means for setting a reference image region on the sample;
   image read-in means for reading in images of said reference image region during FIB processing;
   arithmetic-and-control means for finding direction and amount of image deviation between before and after ion beam irradiation from the images read in by the image-reading means during FIB processing; and
   beam deflection system-adjusting means for correcting a beam deflection system based on the direction and amount of the image deviation in response to an output from said arithmetic-and-control means,
   wherein if a checking image obtained after the ion beam irradiation has brightness or contrast not suitable for detection of the deviation, said image deviation is found using a checking image obtained at appropriate brightness or contrast.

* * * * *